US010672485B2

(12) United States Patent
Arakawa

(10) Patent No.: US 10,672,485 B2
(45) Date of Patent: Jun. 2, 2020

(54) SEMICONDUCTOR STORAGE DEVICE

(71) Applicant: Winbond Electronics Corp., Taichung (TW)

(72) Inventor: Kenichi Arakawa, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/244,128

(22) Filed: Jan. 10, 2019

(65) Prior Publication Data

US 2019/0214098 A1 Jul. 11, 2019

(30) Foreign Application Priority Data

Jan. 11, 2018 (JP) .................. 2018-002281

(51) Int. Cl.
*G11C 16/26* (2006.01)
*G11C 16/30* (2006.01)
*G11C 16/04* (2006.01)
*G11C 5/14* (2006.01)
*G11C 7/02* (2006.01)

(52) U.S. Cl.
CPC ............. *G11C 16/30* (2013.01); *G11C 5/145* (2013.01); *G11C 16/0483* (2013.01); *G11C 16/26* (2013.01); *G11C 7/02* (2013.01)

(58) Field of Classification Search
CPC .................................. G11C 16/26; G11C 8/10
USPC ....................... 365/185.12, 230.06
See application file for complete search history.

(56) References Cited

U.S. PATENT DOCUMENTS

| 8,531,901 | B2 | 9/2013 | Ogiwara et al. |
| 9,633,706 | B1* | 4/2017 | Kim .................... G11C 11/1653 |
| 2002/0141238 | A1 | 10/2002 | Pasternak |
| 2005/0237798 | A1* | 10/2005 | Urabe .................... G11C 16/24 365/185.03 |

(Continued)

FOREIGN PATENT DOCUMENTS

| CN | 103904885 | 7/2014 |
| JP | 2004526239 | 8/2004 |

(Continued)

OTHER PUBLICATIONS

"Office Action of Japan Counterpart Application," dated Nov. 27, 2018, with English translation thereof, p. 1-p. 7.

(Continued)

*Primary Examiner* — Michael T Tran
(74) *Attorney, Agent, or Firm* — JCIPRNET

(57) ABSTRACT

A semiconductor storage device achieving stabilization of an operating voltage of a selected memory chip. A flash memory device of the disclosure includes a master chip and at least one slave chip. A voltage output portion of a charge pump circuit of the master chip is connected to an internal pad of the master chip, and a voltage output portion of a charge pump circuit of the slave chip is connected to an internal pad of the slave chip, the internal pad of the master chip and the internal pad of the slave chip are connected by a wire. When the mater chip is operated, the charge pump circuit of the master chip is turned off, the charge pump circuit of the slave chip is turned on, and a voltage generated by the charge pump circuit of the slave chip is supplied to the master chip.

15 Claims, 7 Drawing Sheets

(56) References Cited

U.S. PATENT DOCUMENTS

| | | | |
|---|---|---|---|
| 2005/0265109 A1* | 12/2005 | Goda | G11C 8/10 365/230.06 |
| 2006/0023522 A1* | 2/2006 | Kwack | G11C 5/14 365/189.11 |
| 2006/0291292 A1* | 12/2006 | Kwon | G11C 8/10 365/185.22 |
| 2008/0031078 A1* | 2/2008 | Kang | G11C 5/145 365/233.1 |
| 2008/0043533 A1* | 2/2008 | Isobe | G11C 8/08 365/185.17 |
| 2010/0118595 A1* | 5/2010 | Bae | G11C 5/145 365/148 |
| 2011/0161606 A1* | 6/2011 | Tanaka | G11C 29/28 711/156 |
| 2012/0203958 A1* | 8/2012 | Jones | G06F 12/0246 711/103 |
| 2013/0070541 A1* | 3/2013 | Chung | G11C 8/10 365/189.09 |
| 2013/0173899 A1* | 7/2013 | Geukes | G06F 21/575 713/2 |
| 2013/0339732 A1* | 12/2013 | Nagai | H04L 9/3234 713/168 |
| 2014/0136927 A1* | 5/2014 | Li | G06F 11/1048 714/768 |
| 2014/0245011 A1* | 8/2014 | Nagai | H04L 63/08 713/171 |
| 2014/0281563 A1* | 9/2014 | Nagai | G06F 21/445 713/185 |
| 2014/0284682 A1* | 9/2014 | Takekida | H01L 29/788 257/316 |
| 2015/0070993 A1* | 3/2015 | Nagadomi | G11C 29/025 365/185.09 |
| 2015/0074406 A1* | 3/2015 | Nagai | G06F 21/44 713/171 |
| 2016/0380532 A1* | 12/2016 | Reddy | H02M 3/07 365/185.18 |
| 2018/0046231 A1* | 2/2018 | Raghu | G06F 1/3225 |
| 2019/0341110 A1* | 11/2019 | Tran | H01L 27/11521 |

FOREIGN PATENT DOCUMENTS

| | | |
|---|---|---|
| JP | 2008300469 | 12/2008 |
| JP | 2014057077 | 3/2014 |
| TW | 1518685 | 1/2016 |

OTHER PUBLICATIONS

"Office Action of Taiwan Counterpart Application," dated Jun. 28, 2019, p. 1-p. 5.

* cited by examiner

SEMICONDUCTOR STORAGE DEVICE

CROSS-REFERENCE TO RELATED APPLICATION

This application claims the priority benefit of Japan application serial no. 2018-002281, filed on Jan. 11, 2018. The entirety of the above-mentioned patent application is hereby incorporated by reference herein and made a part of this specification.

BACKGROUND

Technical Field

The present disclosure relates to a semiconductor storage device in which a plurality of dies or chips are stacked, and more particularly to a flash memory equipped with a sequential peripheral interface (SPI) function.

Description of Related Art

A multi-chip package refers to a stack of a plurality of dies or chips of the same type or different types in one package. For example, a plurality of memory chips of the same type may be stacked to expand the storage capacity, or a plurality of different types of memory chips are stacked to provide different storage functions. For example, the non-volatile semiconductor storage device disclosed in Japanese Patent Publication No. 2008-300469 is configured by laminating a plurality of memory array chips and their control chips, and aligning the through electrodes of the memory array chips with the through electrodes of the control chips, thereby electrically connecting the two through electrodes. In addition, the semiconductor device disclosed in Japanese Patent Publication No. 2014-57077 is configured by laminating a master flash memory chip and a slave flash memory chip, in which the slave flash memory chip does not have a non-core circuit, and receives signals and voltages required for operation from the master flash memory chip.

In a conventional memory device including stacked memory chips, each memory chip monitors an address output from the host computer and detects whether or not it is selected. The host computer does not need to provide a specific instruction for selecting one of the memory chips, it merely outputs an instruction or an address to the memory device as if the memory device includes a monolithic memory chip. Alternatively, in another conventional memory device, the host computer outputs the chip selecting signal for selecting memory chip to the memory device, and the memory chip detects whether or not it is selected based on the chip selecting signal.

In addition, it is also possible to set one of the stacked memory chips as the master memory chip and the others as the slave memory chips to recognize the master chip. The master/slave setting may be performed, for example, by a fuse or a metal option. For example, the identification (ID) of the memory chip on the master side is set to "00", and the ID of the memory chip on the slave side is set to "01", and the memory chip on the master side may be selected when the block address "10" is at logical low level (BA10=L), and the memory chip on the slave side may be selected when the block address "10" is at logical high level (BA10=H).

The flash memory device requires a higher voltage for operations such as reading, programming, erasing, etc., and therefore needs to be equipped with a charge pump circuit which boosts the power voltage Vcc supplied from the external terminal. FIG. 1 is a schematic view showing an internal configuration of a conventional flash memory device in which a plurality of memory chips are stacked. As shown in FIG. 1, the flash memory device 10 includes, for example, a master chip 20 and a slave chip 30 having the same configuration. The master chip 20 and the slave chip 30 respectively include a charge pump circuit 22 and a charge pump circuit 32; and the charge pump circuit 22 and the charge pump circuit 32 are respectively coupled to an internal pad 24 and an internal pad 34. In addition, the internal pad 24 and the internal pad 34 together are connected to the external terminal 12 coupled to the power voltage Vcc through the wire 14.

The power voltage Vcc supplied from the external terminal 12 is supplied to the charge pump circuits 22, 32 through the wire 14 and the internal pads 24, 34, and the charge pump circuits 22, 32 may boost the power voltage Vcc to the desired target voltage. Here, the charge pump circuits 22, 32 are enabled (turned on) in the selected memory chip and disabled (turned off) in the unselected memory chip. For example, in the case where the master chip 20 is selected, the charge pump circuit 22 is enabled and the charge pump circuit 32 is disabled. To the contrary, in the case where the slave chip 30 is selected, the charge pump circuit 32 is enabled, and the charge pump circuit 22 is disabled.

Here, for example, an NAND type memory chip equipped with an SPI function has a continuous reading mode. In the continuous reading mode, pages are read in parallel from the memory cell array and the read data is output continuously. During the period of reading pages, when the host computer sends a data output instruction, in synchronization with the serial clock signal, the flash memory outputs the page data read from the memory cell array from the output circuit in series. In the operation of reading page from the memory cell array, due to the operation of the charge pump circuits 22/32, there is noise in the power voltage Vcc during the reading operation. Therefore, the reading operation is synchronized with the relatively low-speed internal clock signal. However, the continuous data output from the output circuit is synchronized with the high-speed serial clock signal. Therefore, if the noise or variation of the power voltage Vcc caused by the operation of the charge pump circuit is induced to the output circuit, it is difficult to properly maintain the performance of the output circuit, and thus the data cannot be accurately output. In particular, for a memory chip operating at a low voltage, if the voltage supplied to the output circuit is decreased, the above problem is likely to occur.

SUMMARY

The present disclosure has been made to solve such problems, and a purpose of the disclosure is to provide a semiconductor storage device that stabilizes an operating voltage of a selected memory chip.

The semiconductor storage device of the present disclosure includes a plurality of memory chips, and each of the memory chips includes: a memory cell array; a charge pump circuit configured to generate a boosted voltage based on a voltage supplied from the outside; a peripheral circuit configured to be operated under the boosted voltage generated by the charge pump circuit; a controller configured to control the charge pump circuit; and an internal interface which provides an electrical connection between the charge pump circuit and the other memory chips, wherein the controller of the unselected memory chip is configured to make the charge pump circuit of the unselected memory chip to operate and supply the boosted voltage generated by the charge pump circuit of the unselected memory chip to the selected memory chip through the internal interface. The controller of the selected memory chip is configured to perform at least one of following operations to stabilize the boosted voltage in the selected memory chip: a first operation of making a part of the charge pump circuit of the selected memory chip to operate, and the other part of the charge pump circuit of the selected memory chip not to operate; a second operation of making a period during which the charge pump circuit of the selected memory chip is operated to be shorter than a period during which the charge pump circuit of the unselected memory chip is operated; and a third operation of making the charge pump circuit of the selected memory chip not to operate in response to receiving an instruction of continuously reading page data from an output circuit.

The semiconductor storage device of the present disclosure includes a plurality of memory chips, and each of the memory chips includes: a memory cell array; a charge pump circuit configured to generate a boosted voltage based on a voltage supplied from the outside; a peripheral circuit configured to be operated under the boosted voltage generated by the charge pump circuit; a controller configured to control the charge pump circuit; and an internal interface comprising an internal pad for electrically connecting the charge pump circuits of the plurality of memory chips to each other and for testing, wherein the controller of the unselected memory chip is configured to make the charge pump circuit of the unselected memory chip to operate and supply the boosted voltage generated by the charge pump circuit of the unselected memory chip to the selected memory chip through the internal interface.

According to the present disclosure, since the charge pump circuit of the unselected memory chip is operated, and the voltage boosted by the charge pump circuit of the unselected memory chip is supplied to the selected memory chip, the operating voltage of the selected memory chip can be stabilized. Further, by partially operating the charge pump circuit of the selected memory chip and the unselected memory chip, the peak value of the current consumption of each memory chip can be suppressed.

DESCRIPTION OF THE EMBODIMENTS

Hereinafter, embodiments of the present disclosure will be described in detail with reference to the accompanying drawings. The semiconductor memory device of the present disclosure includes a plurality of stacked chips, in which one of the chips is on the master side and one or more chips are on the slave side. Each chip can be NAND type or NOR type flash memory. However, the semiconductor memory device of the present disclosure may also include a chip being a dynamic random access memory (DRAM) different from the flash memory or other memory chip or a stack of logical chips. Further, the flash memory may also be equipped with an SPI function capable of inputting and outputting data in synchronization with a clock signal.

Figure 1:
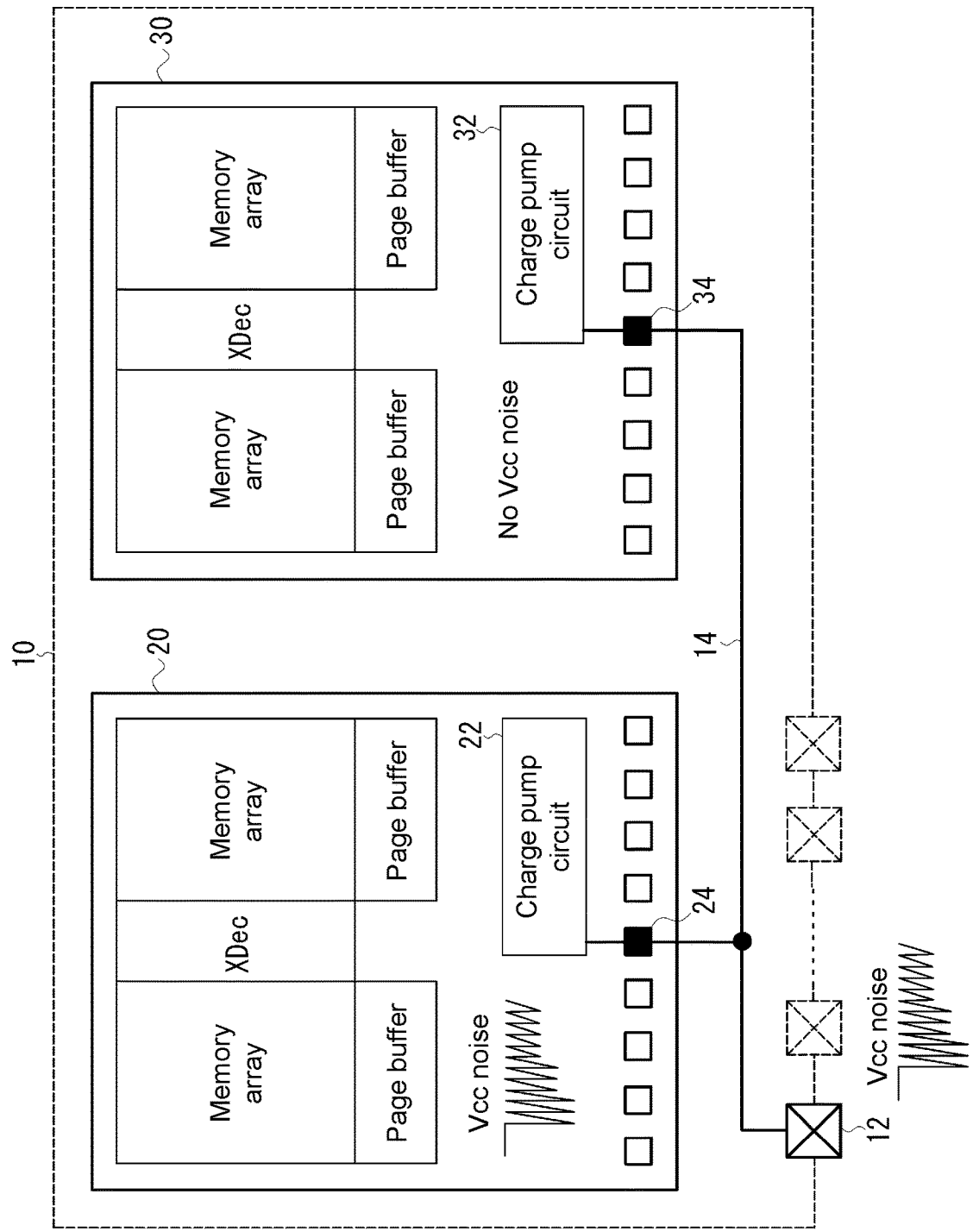
FIG. 1 is a schematic view showing an internal configuration of a conventional flash memory device with stacked memory chips.
Figure 2:
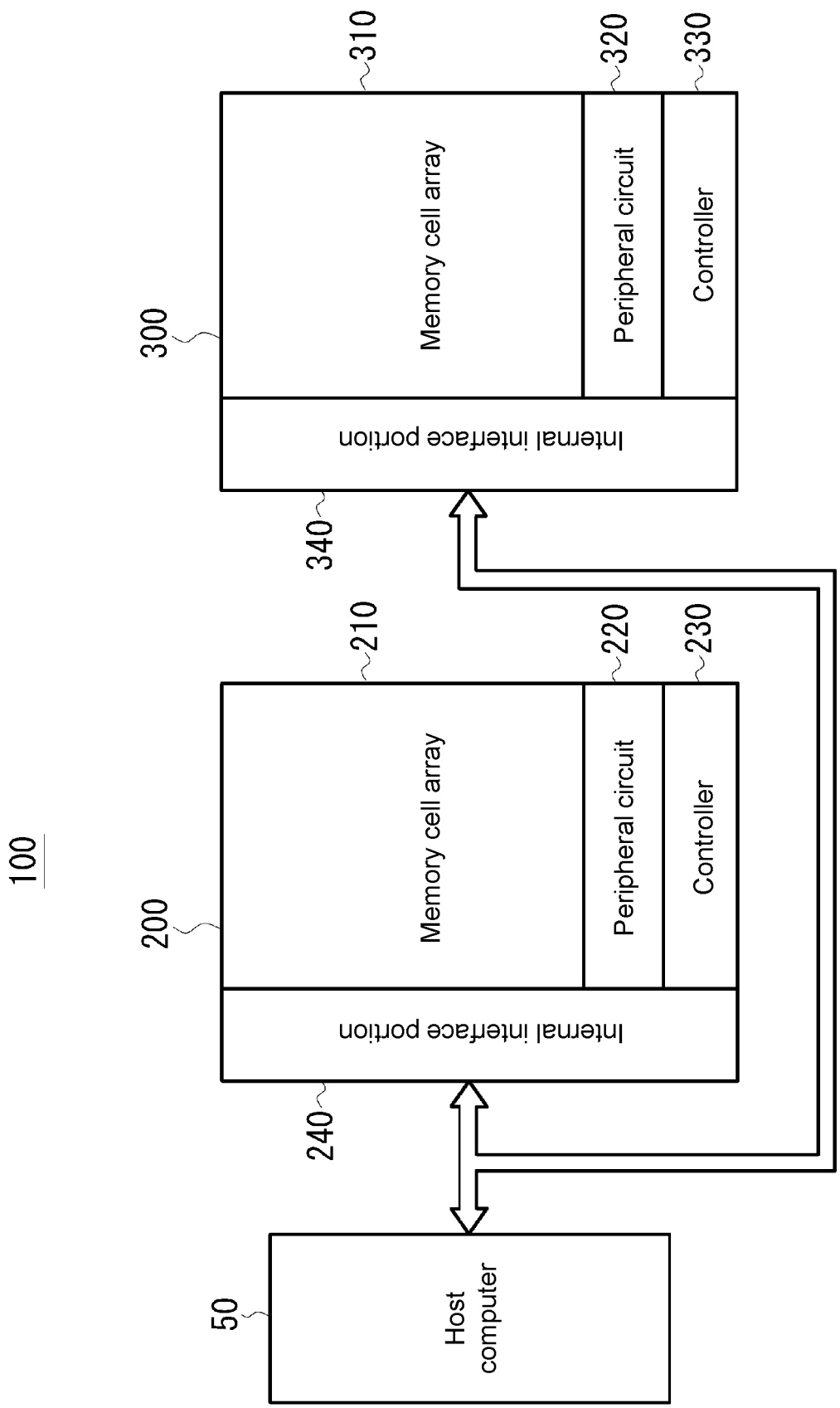
FIG. 2 is a schematic view showing an overall configuration of a flash memory device according to an embodiment of the disclosure.

FIG. 2 illustrates a schematic configuration of a flash memory device according to an embodiment of the disclosure. The flash memory device 100 includes a plurality of stacked memory chips. Here, the selected memory chip is referred to as a memory chip 200 (hereinafter referred to as a master chip) on the master side, and the unselected memory chip is referred to as a memory chip 300 (hereinafter referred to as a slave chip) on the slave side. In this embodiment, one slave chip 300 is illustrated as an example, but the flash memory device 100 may also include two or more slave chips.

The flash memory device 100 includes, for example, a ball grid array (BGA) package or a chip scale package (CSP) package. For example, the BGA package is configured by flip-chip mounting the stacked master chip and the slave chip on the flexible circuit substrate, or being connected to the circuit substrate through wire-bonding.

The master chip 200 includes: a memory cell array 210 including a plurality of NAND string units; a peripheral circuit 220 including a decoder (such as a row decoder Xdec) for selecting a row or a column of the memory cell array 210 or a page buffer/a sensing circuit; a controller 230 controlling the overall operation of the master chip 200; an internal interface portion 240 including a plurality of internal pads. The slave chip 300 has the same configuration as the master chip 200, that is, including: a memory cell array 310 including a plurality of NAND string units; a peripheral circuit 320 including a decoder for selecting a row or a column of the memory cell array 310 or a page buffer/a sensing circuit and so on; a controller 330 controlling the overall operation of the slave chip 300; the internal interface portion 340 including a plurality of internal pads.

The external terminal of the flash memory device 100 may be shared by the master chip 200 and the slave chip 300, that is, each of the plurality of external terminals is connected to the internal pads corresponding to the internal interface portion 240 and the internal interface portion 340, respectively. The flash memory device 100 may include, for example, an external terminal for a power voltage Vcc, an external terminal for grounding (GND), an external terminal for data registration output, an external terminal for inputting a control signal (for example, an address latch enabling signal, an instruction latch enabling signal, etc.), an external terminal that outputs busy signal/ready signal, a terminal for inputting the clock signal, and so on. However, since the operation of the flash memory device equipped with the SPI function is compatible with the NOR type flash memory, it may also include an input terminal for inputting data, an output terminal for outputting data, a clock terminal for inputting a clock signal, a chip selecting terminal, a write protect terminal, etc., and does not necessarily include a terminal that outputs a busy signal or a ready signal.

The master chip 200 and the slave chip 300 are connected to the host computer 50 through the internal interface portion 240/internal interface portion 340 and an external terminal, and the host computer 50 sends instructions or address for reading, programming, erasing, and so forth to the flash memory device 100. In an embodiment, the controller 230/controller 330 monitor the address input from the host computer 50 through the internal interface portion 240/internal interface portion 340 and determine which one of the memory chips is selected. The instruction sent by the host computer 50 will be executed on the selected one of the master chip 200 and the slave chip 300. In another embodiment, the host computer 50 outputs a chip selecting signal CS for selecting a chip, the controllers 230/330 determine which one of the master chip 200 and the slave chip 300 is selected based on the chip selecting signal CS, and the selected chip executes an instruction sent by the host computer 50.

Figure 3:
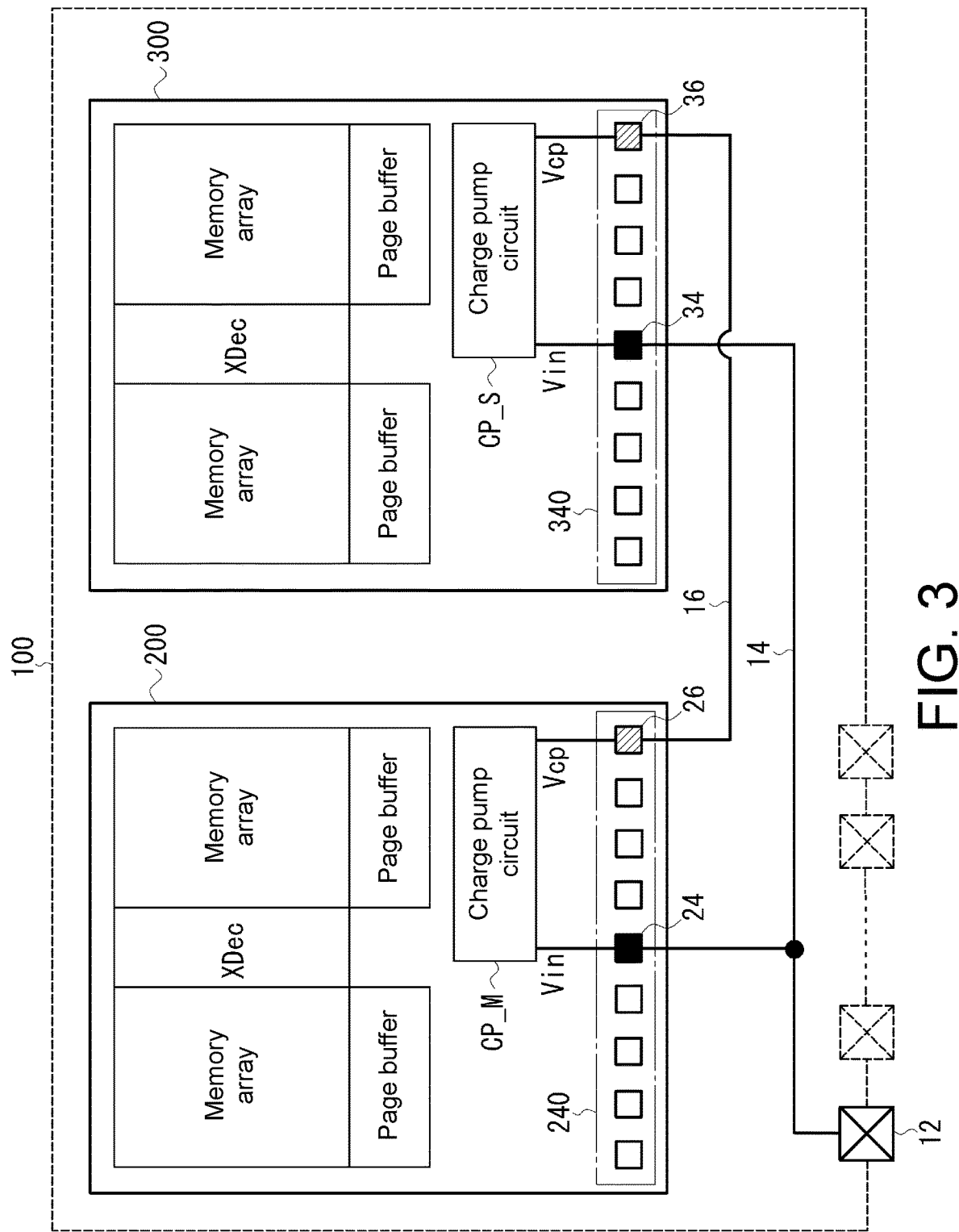
FIG. 3 is a schematic view showing a connection relationship between an external power terminal of a flash memory device and an internal pad of a memory chip according to an embodiment of the present disclosure.

FIG. 3 illustrates the master chip 200 and the slave chip 300 and their charge pump circuits according to the embodiment. The external terminal 12 for the power voltage Vcc of the flash memory device 100 is connected to both of the internal pad 24 of the master chip 200 and the internal pad 34 of the slave chip 300 through the wire 14, and the internal pad 24 and internal pad 34 are respectively connected to the voltage input portion Vin of the charge pump circuit CP_M and the voltage input portion Vin of the charge pump circuit CP_S. Further, the voltage output portion Vcp of the charge pump circuit CP_M of the master chip 200 is connected to the internal pad 26 via a wire, and the voltage output portion Vcp of the charge pump circuit CP_S of the slave chip 300 is connected to the internal pad 36 through a wire. The internal pad 26 and the internal pad 36 are electrically connected through a wire 16.

Figure 4:
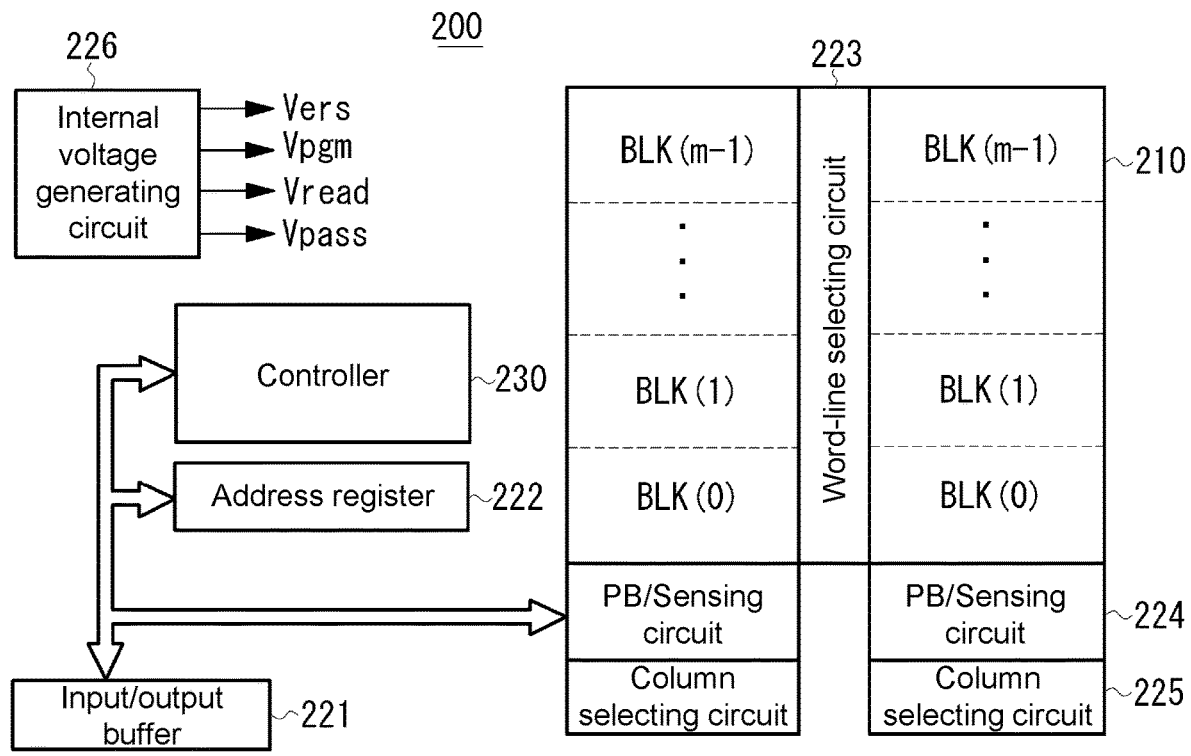
FIG. 4 is a block diagram showing a schematic configuration of a master chip according to an embodiment of the present disclosure.

FIG. 4 is a diagram showing an internal configuration of a master chip according to the embodiment. The memory cell array 210 has two memory planes or memory banks on both sides of the word-line selecting circuit 223, and has m memory blocks BLK(0), BLK (1), . . . , BLK (m−1) in the column direction of each memory plane. Each memory block has a plurality of NAND string units in which a plurality of memory units are connected in series.

The peripheral circuit 220 includes an input/output buffer 221 which transmits and receives data and the like through the internal interface portion 240; an address register 222 which receives the address data through the input/output buffer 221; a word-line selecting circuit 223 which selects block and word lines and so on based on the row address information Ax from the address register 222; a page buffer/a sensing circuit 224 which maintains the data read from the page selected by the word-line selecting circuit 223 or maintains the input data which should be programmed on the selected page; a column selecting circuit 225 which selects the data of the column address in the page buffer/sensing circuit 224 based on the column address information Ay from the address register 222; and an internal voltage generating circuit 226 which generates various voltages (write voltage Vpgm, pass voltage Vpass, read pass voltage Vread, erase voltage Vers, etc.) required for reading, programming, erasing, etc. The internal voltage generating circuit 226 includes the charge pump circuit CP_M shown in FIG. 3, and generates a required voltage based on the power voltage Vcc supplied to the internal pad 24.

The controller 230 receives an instruction or the like through the internal interface portion 240 and the input/output buffer 221, and controls the operation of the master chip 200. In addition, as described above, the controller 230 determines whether or not the master chip 200 is selected based on the address from the host computer 50 or the chip selecting signal CS.

In the read operation of the memory cell array 210, a positive voltage is applied to the bit line, 0 V, for example, is applied to the selected word line, a pass voltage is applied to the unselected word line, and 0 V is applied to the common source line. In the programming operation, a high write voltage Vpgm is applied to the selected word line, an intermediate potential is applied to the unselected word line, and a potential corresponding to the data "0" or "1" is supplied to the bit line GBL. In the erase operation, 0 V is applied to the selected word line in the block, a high voltage is applied to the P well, and the electrons of the floating gate are extracted to the substrate, thereby erasing the data in units of blocks.

In the flash memory equipped with the SPI function, it is possible to continuously output the read page data from the input/output buffer 221 during the period of reading the selected page of the memory cell array 210. When the memory cell array 210 is divided into two memory planes, it is possible to synchronously output the page data read from another memory plane and the serial clock signal SCLK supplied to the external terminal in series during the period of reading the page data from one of the memory planes. The read speed of the memory cell array is, for example, 20 MHz, and the read speed by means of the serial clock signal SCLK is, for example, 166 MHz. Further, the external terminal for inputting and outputting data is, for example, ×1, ×4 or ×8.

The internal voltage generating circuit 226 includes a charge pump circuit CP_M. As shown in FIG. 3, the charge pump circuit CP_M receives the power voltage Vcc supplied to the flash memory device 100 through the external terminal 12 and the internal pad 24 to generate a desired voltage. The voltage generated by the charge pump circuit CP_M/charge pump circuit CP_S is supplied to the peripheral circuit 220 of the master chip 200 when the master chip 200 is being selected.

Figure 5A:
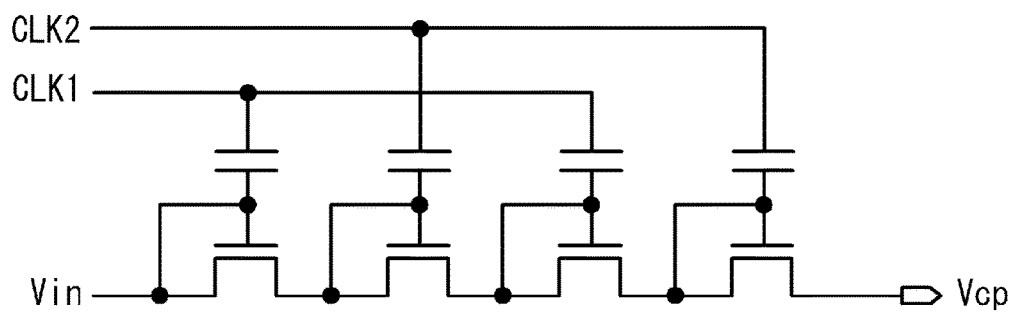
FIG. 5A and FIG. 5B are schematic views showing an example of a charge pump circuit according to an embodiment of the present disclosure.
Figure 5B:
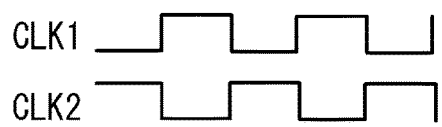

An example of the configuration of the charge pump circuit is shown in FIG. 5A. The charge pump circuit includes a metal oxide semiconductor (MOS) transistor connected to a plurality of diodes, and each of the MOS transistors is connected in series. Further, a capacitor is connected to the gate of the MOS transistor, a clock signal CLK1 is applied to each capacitor of the odd-numbered MOS transistors, and a clock signal CLK2 is applied to each capacitor of the even-numbered MOS transistors. As shown in FIG. 5B, the clock signal CLK1 and the clock signal CLK2 are in a phase difference of 180 degrees. The power voltage Vcc is supplied to the voltage input portion Vin of the charge pump circuit through the internal pad, and the boosted voltage is output from the voltage output portion Vcp.

Figure 6:
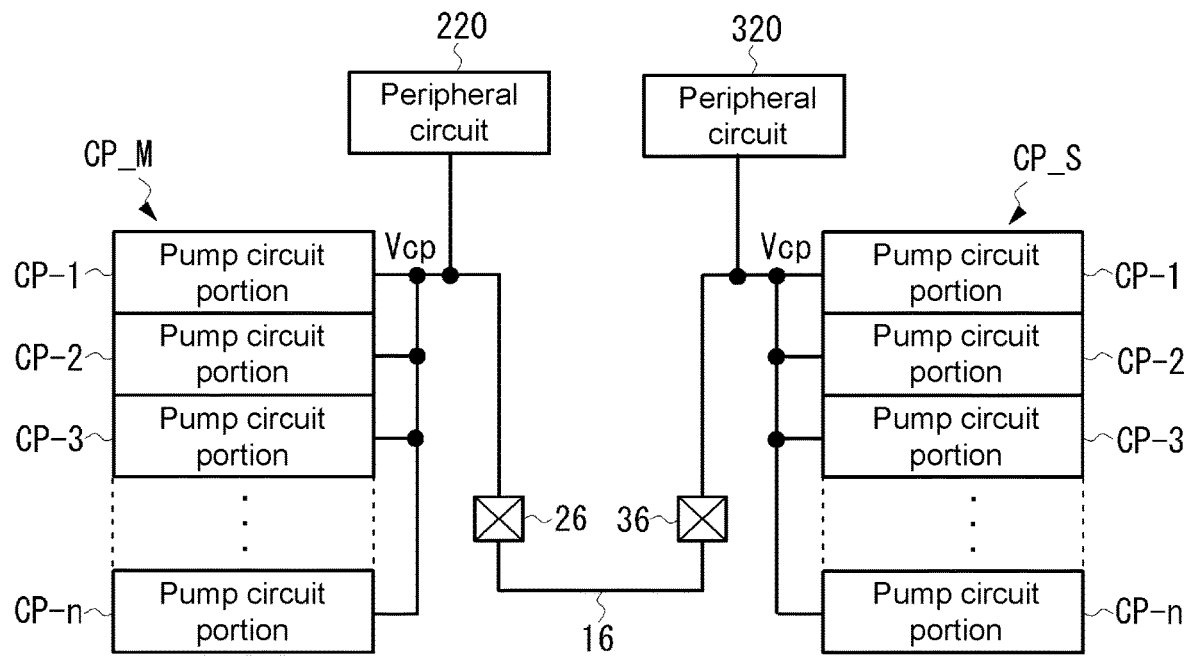
FIG. 6 is a schematic diagram showing a connection relationship between a charge pump circuit and an internal pad according to an embodiment of the present disclosure.

In one embodiment, the charge pump circuit includes a plurality of pump circuit portions and is capable of causing the selected ones of the plurality of pump circuit portions to operate. An example of the charge pump circuits of the present embodiment is shown in FIG. 6. As shown in FIG. 6, each of the charge pump circuit CP_M and the charge pump circuit CP_S includes n sets of pump circuit portions CP-1, CP-2, . . . , CP-n (n is an integer of 2 or more). A pump circuit portion has the elements shown in FIG. 5A and FIG. 5B, and the voltage input portions Vin of the pump circuit portions CP-1, CP-2, . . . , CP-n and the voltage output portions Vcp are respectively connected in parallel. If the current consumption for making one pump circuit portion to operate is Ip, the current consumption for making all the pump circuit portions to operate is Ip×n.

The voltage output portions Vcp of the n sets of pump circuit portions of the charge pump circuit CP_M are commonly connected to the peripheral circuit 220 of the master chip 200, and the voltage output portions Vcp of the n sets of pump circuit portions of the charge pump circuit CP_S are commonly connected to the peripheral circuit 320 of the slave chip 300, thereby supplying the required voltage to the peripheral circuits 220/320. Further, the voltage output portion Vcp of the charge pump circuit CP_M is connected to the internal pad 26, and the voltage output portion Vcp of the charge pump circuit CP_S is connected to the internal pad 36, such that the voltage generated in the charge pump circuit CP_M can be supplied to the slave chip 300 or the voltage generated in the charge pump circuit CP_S can be supplied to the master chip 200.

Figure 7:
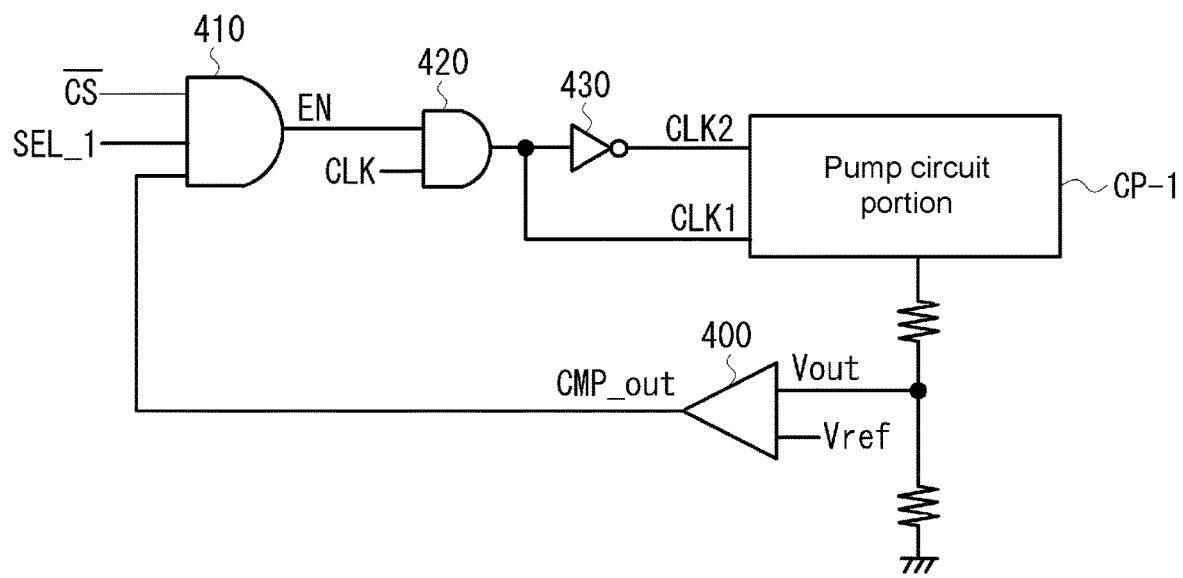
FIG. 7 is a schematic view showing a configuration of selecting a pump circuit portion according to an embodiment of the present disclosure.

The charge pump circuits CP_M/CP_S are capable of making the selected one(s) of the pump circuit portions to operate. For example, in the selected one of the memory chips, a part of the pump circuit portions can be turned on, or all the pump circuit portions can be turned off. An example of a circuit for selectively operating the pump circuit portion CP-1 is shown in FIG. 7. The comparator 400 compares the target voltage Vref with the voltage Vout output from the voltage output portion Vcp. If Vout<Vref, a comparison result CMP_out of H potential is output to the AND gate 410, if Vout≥Vref, then a comparison result CMP_out of L potential is output to the AND gate 410.

Further, the inverted chip selecting signal $\overline{CS}$ and the selecting signal SEL_1 for selecting the pump circuit portion CP-1 are provided from the controller 230 to the AND gate 410. When the master chip 200 is not selected, the inverted chip selecting signal $\overline{CS}$ is at the H potential. When the pump circuit portion CP-1 is operated, the selecting signal SEL_1 is the H potential. When the output voltage Vout is lower than the target voltage Vref, the comparison result is the H potential. Accordingly, the enabling signal EN output by the AND gate 410 is the H potential. The AND gate 420 receives the enabling signal EN output from the AND gate 410 and the clock signal CLK and generates the clock signal CLK1. The inverter 430 inverts the clock signal CLK1 to generate a clock signal CLK2.

Next, an operating method of the charge pump circuit of the first embodiment of the present disclosure is described. In the first embodiment, as shown in Table 1, the charge pump circuit of the selected memory chip (master chip 200) is turned off, and the charge pump circuit of the unselected memory chip (slave chip 300) is turned on. Then, the voltage generated in the charge pump circuit of the unselected memory chip (slave chip 300) is supplied to the selected memory chip (master chip 200).

TABLE 1

| Memory chip | Charge pump circuit |
| --- | --- |
| Selected | Turned off |
| Not selected | Turned on |

Figure 8:
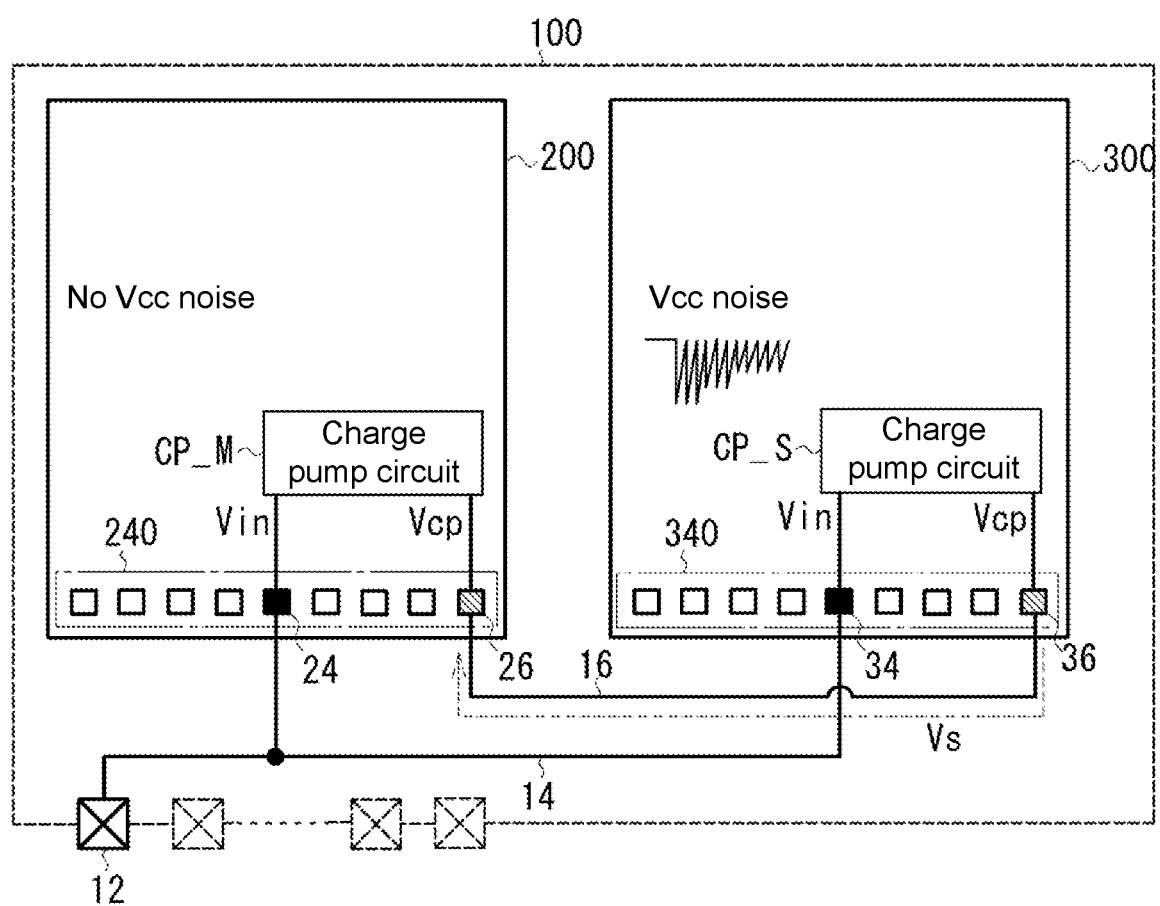
FIG. 8 is a schematic view for explaining an operation of a charge pump circuit according to a first embodiment of the present disclosure.

FIG. 8 shows a situation where the charge pump circuit CP_S of the slave chip 300 is turned on and the charge pump circuit CP_M of the master chip 200 is turned off. The voltage Vs output from the voltage output portion Vcp of the charge pump circuit CP_S is supplied to the voltage output portion Vcp of the charge pump circuit CP_M of the master chip 200 through the internal pad 36, the wire 16 and the internal pad 26.

In the case of performing the above operation, in the master chip 200, the inverted chip selecting signal $\overline{CS}$ becomes the L potential, or the selecting signal SEL_1 to SEL_n are set as the L potential, such that the n sets of the pump circuit portions CP-1~CP-n in the charge pump circuit CP_M are all turned off. On the other hand, in the slave chip 300, the inverted chip selecting signal $\overline{CS}$ becomes the H potential, and the selecting signals SEL_1 to SEL_n are set as the H potential, such that the n sets of the pump circuit portions CP-1 to CP-n of the charge pump circuit CP_S are all turned on.

In the slave chip 300, the power voltage Vcc in the slave chip 300 is reduced or has noise due to the power consumption caused by the operation of the charge pump circuit CP_S; however, since the slave chip 300 is not selected, such Vcc noise does not bring negative influence on the operation of the slave chip 300. On the other hand, in the master chip 200, since the charge pump circuit CP_M is turned off, the charge pump circuit CP_M does not generate power consumption. Therefore, a large power voltage Vcc noise or voltage drop is not generated in the master chip 200, thereby stabilizing the power voltage Vcc. From a package point of view, the current consumption Icc is the same as in the conventional case. However, from a chip point of view, in the selected memory chip, since the internal charge pump circuit is not operated, the current consumption Icc is significantly reduced, and the peak current is also considerably reduced.

Figure 9:
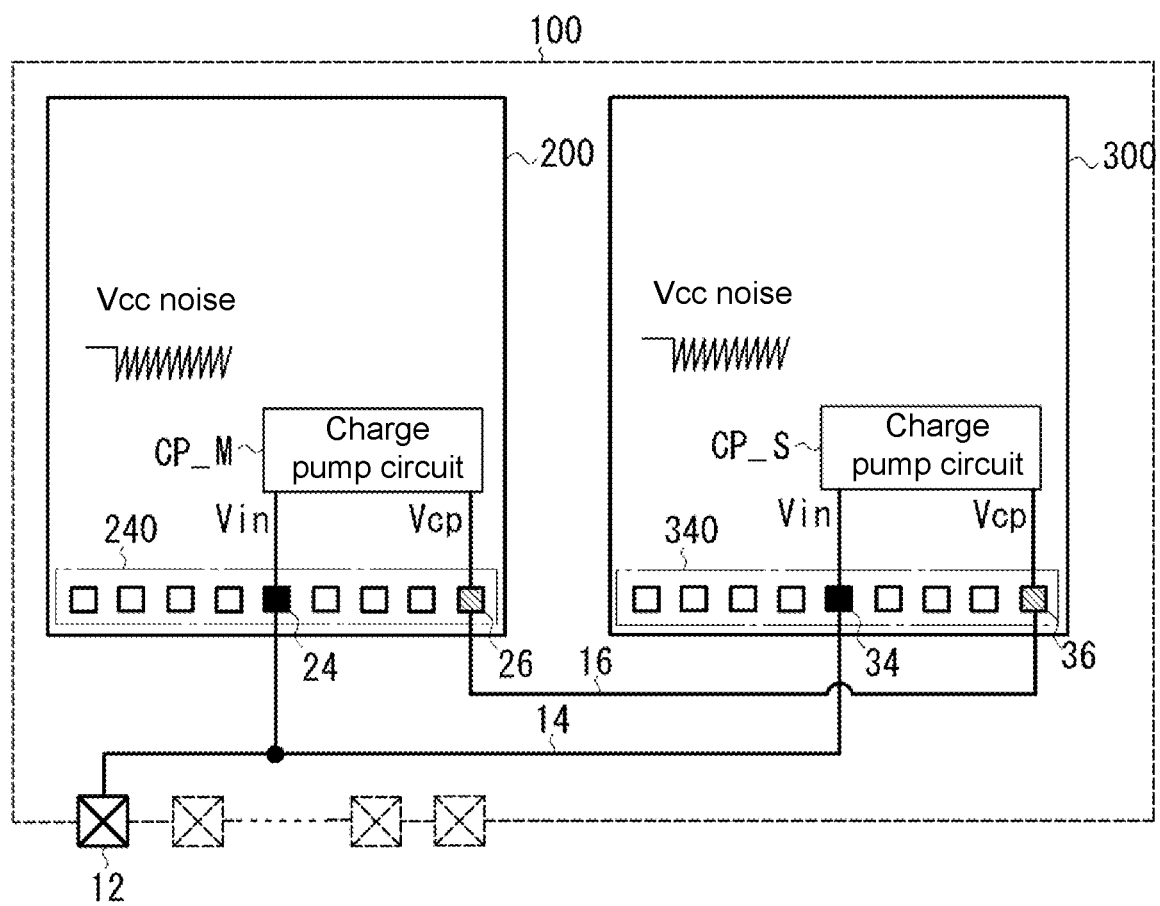
FIG. 9 is a schematic view for explaining an operation of a charge pump circuit according to a second embodiment of the present disclosure.

Next, a second embodiment of the present disclosure will be described with reference to Table 2 and FIG. 9. In the first embodiment, the charge pump circuit of the selected memory chip is completely turned off, but in the second embodiment, a part of the charge pump circuit of the selected memory chip is turned on, and a part of the charge pump circuit of the unselected memory chip is turned on. In a preferred embodiment, as shown in Table 2, ½ of the charge pump circuit is turned on, respectively.

TABLE 2

| Memory chip | Charge pump circuit |
| --- | --- |
| Selected | ½ turned on |
| Not selected | ½ turned on |

In the master chip 200, the controller 230 inverts the inverted chip selecting signal $\overline{CS}$ from the L potential to the H potential, and sets the selecting signals SEL_1, SEL_2, . . . , SEL_n/2 of half of the pump circuit portions in the n sets of pump circuit portions as the H potential, such that n/2 sets of the pump circuit portions are turned on. Similarly, in the slave chip 300, half of pump circuit portions of the charge pump circuit CP_S is turned on.

Here, if the voltage Vm of the voltage output portion Vcp of the charge pump circuit CP_M is equal to the voltage Vs of the voltage output portion Vcp of the charge pump circuit CP_S, since there is resistance of the internal pad 26, the internal pad 36 and the wire 16 and the like between the master chip 200 and the slave chip 300, it is difficult to supply the voltage Vs to the master chip 200. Therefore, it is also possible to control the charge pump circuit CP_S or the charge pump circuit CP_M such that the voltage Vs generated by the charge pump circuit CP_S is higher than the voltage Vm generated by the charge pump circuit CP_M.

In the present embodiment, ½ of the charge pump circuit CP_M is operated in the master chip 200. Therefore, some Vcc noise is generated as compared with the case of the first embodiment, but Vcc noise can be suppressed as compared to the conventional case. Further, in the above example, ½ of the charge pump circuit CP_M/charge pump circuit CP_S is operated separately. However, for example, m of the charge pump circuits CP_M of the master chip 200 may be operated, and n-m of the charge pump circuits CP_S of the slave chip 300 may be operated. In this case, it is preferable that the number of the pump circuit portions that are operated in the master chip 200 is smaller than the number of the pump circuit portions that are operated in the slave chip 300, thereby suppressing the Vcc noise of the master chip 200.

Next, a third embodiment of the present disclosure will be described. In the third embodiment, in the master chip 200, it is possible to make a part or all of the charge pump circuits CP_M of the master chip 200 to be turned on during the period of reading the page from the memory cell array. In the subsequent continuous read operation of page data, the charge pump circuit CP_M is turned off. In this case, the controller 230/controller 330 make the charge pump circuit CP_M of the master chip 200 to turn off and the charge pump circuit CP_S of the slave chip 300 to turn on in response to receiving a continuous read instruction from the host computer 50. Thus, when the page data is continuously outputted in the master chip 200, it is possible to suppress the Vcc noise from being induced to the output circuit.

In an alternative embodiment, the controllers in the master chip 200 and the slave chip 300 make a period during which the charge pump circuit of the selected memory chip is operated to be shorter than a period during which the charge pump circuit of the unselected memory chip is operated.

Next, a fourth embodiment of the present disclosure will be described. The first to third embodiments use the internal pad 26 and the internal pad 36 exclusive for the master chip 200 and the slave chip 300. However, in that case, adding of internal pads are required. Therefore, in the fourth embodiment, the internal pad which is not used in the normal operation is shared for use of connecting to the charge pump circuit. For example, the test terminal is included in the internal pad, and the test terminal is used during the test before the memory chip is packaged, and is not used afterwards. Therefore, after the test is completed, before packaging, the test terminals of the respective memory chips are connected to the voltage output portion Vcp of the charge pump circuit CP_M/charge pump circuit CP_S, and the test terminals are connected by the wire 16. In this manner, it is possible to avoid the number of the internal pad from increasing, thereby miniaturizing the memory chip.

The preferred embodiments of the present disclosure have been described in detail, but the present disclosure is not limited to the specific embodiments, and various modifications and changes can be made without departing from the scope of claims.

What is claimed is:

1. A semiconductor storage device, comprising a plurality of memory chips, wherein:
 each of the memory chips comprising:
 a memory cell array;
 a charge pump circuit, configured to generate a boosted voltage based on a voltage supplied from the outside;
 a peripheral circuit, configured to be operated under the boosted voltage generated by the charge pump circuit;
 a controller, configured to control the charge pump circuit; and
 an internal interface, providing an electrical connection between the charge pump circuit and other memory chips,
 wherein the controller of the unselected memory chip is configured to make the charge pump circuit of the unselected memory chip to operate, and supply the boosted voltage generated by the charge pump circuit of the unselected memory chip to the selected memory chip through the internal interface,
 wherein the controller of the selected memory chip is configured to perform at least one of following operations to stabilize the boosted voltage in the selected memory chip:
 a first operation of making a part of the charge pump circuit of the selected memory chip to operate, and the other part of the charge pump circuit of the selected memory chip not to operate;
 a second operation of making a period during which the charge pump circuit of the selected memory chip is operated to be shorter than a period during which the charge pump circuit of the unselected memory chip is operated; and
 a third operation of making the charge pump circuit of the selected memory chip not to operate in response to receiving an instruction of continuously reading page data from an output circuit.

2. The semiconductor storage device as claimed in claim 1, wherein
 the controller of the selected memory chip makes the charge pump circuit of the selected memory chip not to operate.

3. The semiconductor storage device as claimed in claim 1, wherein
 the charge pump circuit comprises n sets of pump circuit portions connected in parallel, the controller of the selected memory chip makes a part of the n sets of pump circuit portions of the selected memory chip to operate, and the controller of the unselected memory chip makes a part of the n sets of pump circuit portions of the unselected memory chip to operate.

4. The semiconductor storage device as claimed in claim 3, wherein
 the controller of the selected memory chip makes a p set of the pump circuit portion of the selected memory chip to operate, and the controller of the unselected memory chip makes an n-p set of the pump circuit portion of the unselected memory chip to operate, wherein p is smaller than 2/n.

5. The semiconductor storage device as claimed in claim 1, wherein
 the internal interface comprises an internal pad for electrically connecting the charge pump circuits of the plurality of memory chips to each other.

6. The semiconductor storage device as claimed in claim 5, wherein
 the internal pad is an internal pad for testing.

7. The semiconductor storage device as claimed in claim 1, wherein the memory chip comprises an NAND type flash memory equipped with a sequence peripheral interface function.

8. The semiconductor storage device as claimed in claim 7, wherein
the NAND type flash memory comprises a function of outputting a read page data through an output circuit to the outside during a period of reading page from the memory cell array by using the boosted voltage generated by the charge pump circuit.

9. A semiconductor storage device, comprising a plurality of memory chips, wherein:
each of the memory chips comprising:
a memory cell array;
a charge pump circuit, configured to generate a boosted voltage based on a voltage supplied from the outside;
a peripheral circuit, configured to be operated under the boosted voltage generated by the charge pump circuit;
a controller, configured to control the charge pump circuit; and
an internal interface, comprising an internal pad for electrically connecting the charge pump circuits of the plurality of memory chips to each other and for testing,
wherein the controller of the unselected memory chip is configured to make the charge pump circuit of the unselected memory chip to operate, and supply the boosted voltage generated by the charge pump circuit of the unselected memory chip to the selected memory chip through the internal interface,
wherein the charge pump circuit comprises n sets of pump circuit portions connected in parallel, the controller of the selected memory chip makes a part of the n sets of pump circuit portions of the selected memory chip to operate, and the controller of the unselected memory chip makes a part of the n sets of pump circuit portions of the unselected memory chip to operate.

10. The semiconductor storage device as claimed in claim 9, wherein
the controller of the selected memory chip makes a p set of the pump circuit portion of the selected memory chip to operate, and the controller of the unselected memory chip makes an n-p set of the pump circuit portion of the unselected memory chip to operate, wherein p is smaller than 2/n.

11. The semiconductor storage device as claimed in claim 9, wherein
the controller of the selected memory chip makes a period during which the charge pump circuit of the selected memory chip is operated to be shorter than a period during which the charge pump circuit of the unselected memory chip is operated.

12. The semiconductor storage device as claimed in claim 9, wherein
the memory chip comprises an NAND type flash memory equipped with a sequence peripheral interface function.

13. The semiconductor storage device as claimed in claim 12, wherein
the NAND type flash memory comprises a function of outputting a read page data through an output circuit to the outside during a period of reading page from the memory cell array by using the boosted voltage generated by the charge pump circuit.

14. The semiconductor storage device as claimed in claim 10, wherein
the controller of the selected memory chip makes a period during which the charge pump circuit of the selected memory chip is operated to be shorter than a period during which the charge pump circuit of the unselected memory chip is operated.

15. A semiconductor storage device, comprising a plurality of memory chips, wherein:
each of the memory chips comprising:
a memory cell array;
a charge pump circuit, configured to generate a boosted voltage based on a voltage supplied from the outside;
a peripheral circuit, configured to be operated under the boosted voltage generated by the charge pump circuit;
a controller, configured to control the charge pump circuit; and
an internal interface, comprising an internal pad for electrically connecting the charge pump circuits of the plurality of memory chips to each other and for testing,
wherein the controller of the unselected memory chip is configured to make the charge pump circuit of the unselected memory chip to operate, and supply the boosted voltage generated by the charge pump circuit of the unselected memory chip to the selected memory chip through the internal interface,
wherein the memory chip comprises an NAND type flash memory equipped with a sequence peripheral interface function, and the NAND type flash memory comprises a function of outputting a read page data through an output circuit to the outside during a period of reading page from the memory cell array by using the boosted voltage generated by the charge pump circuit.

* * * * *